(12) United States Patent
Lee

(10) Patent No.: US 12,230,557 B2
(45) Date of Patent: Feb. 18, 2025

(54) SEMICONDUCTOR PACKAGE

(71) Applicant: Samsung Electronics Co., Ltd., Suwon-si (KR)

(72) Inventor: Sangwon Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 466 days.

(21) Appl. No.: 17/668,538

(22) Filed: Feb. 10, 2022

(65) Prior Publication Data

US 2022/0367331 A1 Nov. 17, 2022

(30) Foreign Application Priority Data

May 14, 2021 (KR) .................. 10-2021-0062974

(51) Int. Cl.
*H01L 23/495* (2006.01)
*H01L 23/00* (2006.01)
*H01L 23/31* (2006.01)
*H01L 23/498* (2006.01)

(52) U.S. Cl.
CPC .... *H01L 23/49822* (2013.01); *H01L 23/3107* (2013.01); *H01L 23/49816* (2013.01); *H01L 23/49894* (2013.01); *H01L 24/42* (2013.01); *H01L 2224/48228* (2013.01)

(58) Field of Classification Search
CPC ........... H01L 23/3128; H01L 23/49816; H01L 25/0657
USPC .................................................. 257/737, 686
See application file for complete search history.

(56) References Cited

U.S. PATENT DOCUMENTS

| | | | |
|---|---|---|---|
| 4,581,680 A * | 4/1986 | Garner ................. | H05K 3/3436 361/776 |
| 4,604,644 A * | 8/1986 | Beckham ............. | H05K 3/3436 257/737 |
| 5,641,946 A * | 6/1997 | Shim .................... | H05K 3/3457 361/767 |
| 5,726,502 A * | 3/1998 | Beddingfield .......... | H01L 24/13 257/E23.179 |
| 6,175,157 B1 * | 1/2001 | Morifuji ................. | H01L 24/81 257/789 |
| 6,444,563 B1 | 9/2002 | Potter et al. | |
| 7,566,961 B2 | 7/2009 | Cho | |
| 8,471,154 B1 | 6/2013 | Yoshida et al. | |
| 8,604,614 B2 * | 12/2013 | Kwon .................... | H01L 25/50 257/737 |

(Continued)

*Primary Examiner* — Nitin Parekh
(74) *Attorney, Agent, or Firm* — Muir Patent Law, PLLC

(57) ABSTRACT

A semiconductor package includes a base substrate having a plurality of upper pads and a plurality of first and second lower pads, a semiconductor chip disposed on the base substrate and electrically connected to the plurality of upper pads, a solder resist layer having a plurality of openings exposing a region of each of the plurality of first and second lower pads, the exposed regions of the plurality of first and second lower pads having the same size, a plurality of first external connection conductors respectively disposed on the exposed regions of the plurality of first lower pads and having a first height and a first volume, and a plurality of second external connection conductors respectively disposed on the exposed regions of the plurality of second lower pads and having a second height, greater than the first height, and a second volume, greater than the first volume.

20 Claims, 8 Drawing Sheets

(56) References Cited

U.S. PATENT DOCUMENTS

| | | | |
|---|---|---|---|
| 8,716,872 B2* | 5/2014 | Kwon | H01L 23/49838 |
| | | | 257/737 |
| 9,253,876 B2 | 2/2016 | Elizondo et al. | |
| 9,385,098 B2* | 7/2016 | Zhang | H01L 24/14 |
| 9,437,551 B2 | 9/2016 | Cheng et al. | |
| 9,461,014 B2* | 10/2016 | Srinivasan | H01L 24/81 |
| 9,941,240 B2 | 4/2018 | Liu et al. | |
| 11,963,307 B2* | 4/2024 | Doyle | B23K 1/0016 |
| 2006/0131744 A1 | 6/2006 | O'Connor et al. | |
| 2007/0205520 A1* | 9/2007 | Chou | H01L 24/12 |
| | | | 257/E23.129 |
| 2010/0109169 A1* | 5/2010 | Kolan | H01L 25/0655 |
| | | | 257/E23.116 |
| 2014/0103522 A1 | 4/2014 | Takemoto | |
| 2017/0278816 A1 | 9/2017 | Li et al. | |
| 2018/0218990 A1 | 8/2018 | Akutsu et al. | |

* cited by examiner

SEMICONDUCTOR PACKAGE

CROSS-REFERENCE TO RELATED APPLICATION(S)

This application claims benefit of priority under 35 U.S.C. § 119 to Korean Patent Application No. 10-2021-0062974 filed on May 14, 2021 in the Korean Intellectual Property Office, the disclosure of which is incorporated herein by reference in its entirety.

BACKGROUND

The present inventive concept relates to a semiconductor package.

With the development of the electronics industry, demand for high functionality, high speed, and miniaturization of electronic components has increased. According to this trend, packages have been manufactured by mounting a plurality of semiconductor chips on a single interposer or a package substrate. Warpage may occur in a semiconductor package due to a difference in coefficients of thermal expansion (CTE) between individual components constituting the semiconductor package, and thus, a technique for improving warpage of the semiconductor package is desirable.

SUMMARY

An aspect of the present inventive concept is to provide a semiconductor package for improving mounting stability when mounted on another substrate (e.g., a motherboard).

According to an aspect of the present inventive concept, a semiconductor package includes: a base substrate having an upper surface on which a plurality of upper pads are arranged and a lower surface on which a plurality of first and second lower pads are arranged and including an interconnection circuit electrically connecting the plurality of upper pads and the plurality of first and second lower pads; a semiconductor chip disposed on the upper surface of the base substrate and electrically connected to the plurality of upper pads; a solder resist layer having a plurality of openings exposing a region of each of the plurality of first and second lower pads, the exposed regions of the plurality of first and second lower pads having substantially the same size; a plurality of first external connection conductors respectively disposed on the exposed regions of the plurality of first lower pads, each of the first external connection conductors having a first height and a first volume; and a plurality of second external connection conductors respectively disposed on the exposed regions of the plurality of second lower pads, each of the second external connection conductors having a second height, greater than the first height, and a second volume, greater than the first volume.

According to an aspect of the present inventive concept, a semiconductor package includes: a base substrate having an upper surface on which a plurality of upper pads are arranged and a lower surface on which a plurality of first and second lower pads are arranged and including an interconnection circuit electrically connecting the plurality of upper pads and the plurality of first and second lower pads; an interposer disposed on the upper surface of the base substrate and having a lower surface on which a plurality of lower connection pads electrically connected to the plurality of upper pads are arranged and an upper surface on which a plurality of upper connection pads electrically connected to the plurality of lower connection pads are arranged; at least one semiconductor chip disposed on the upper surface of the interposer and electrically connected to the plurality of upper connection pads; a solder resist layer having a plurality of openings exposing a region of each of the plurality of first and second lower pads, the exposed regions of the plurality of first and second lower pads having substantially the same size; a plurality of first external connection conductors respectively disposed on the exposed regions of the plurality of first lower pads and having a first height and a first volume; and a plurality of second external connection conductors respectively disposed on the exposed regions of the plurality of second lower pads and having a second height, greater than the first height, and a second volume, greater than the first volume.

According to an aspect of the present inventive concept, a semiconductor package includes: a first semiconductor package including a first substrate and a first semiconductor chip disposed on the first substrate; a second semiconductor package disposed on the first semiconductor package and including a second substrate and a second semiconductor chip on the second substrate; and a connection member disposed between the first semiconductor package and the second semiconductor package and electrically connecting the first semiconductor package to the second semiconductor package, wherein the second semiconductor package includes: a plurality of lower pads arranged on a lower surface of the second substrate; a solder resist layer disposed on a lower surface of the second substrate, having a plurality of openings exposing a region of each of the plurality of lower pads, the exposed regions of the plurality of lower pads having substantially the same size; and a plurality of external connection conductors respectively disposed on the exposed regions of the plurality of lower pads, wherein the plurality of external connection conductors include an external connection conductor having a volume and a height respectively greater than a volume and a height of other external connection conductors.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, various embodiments of the present inventive concept will be described with reference to the accompanying drawings.

Figure 1:
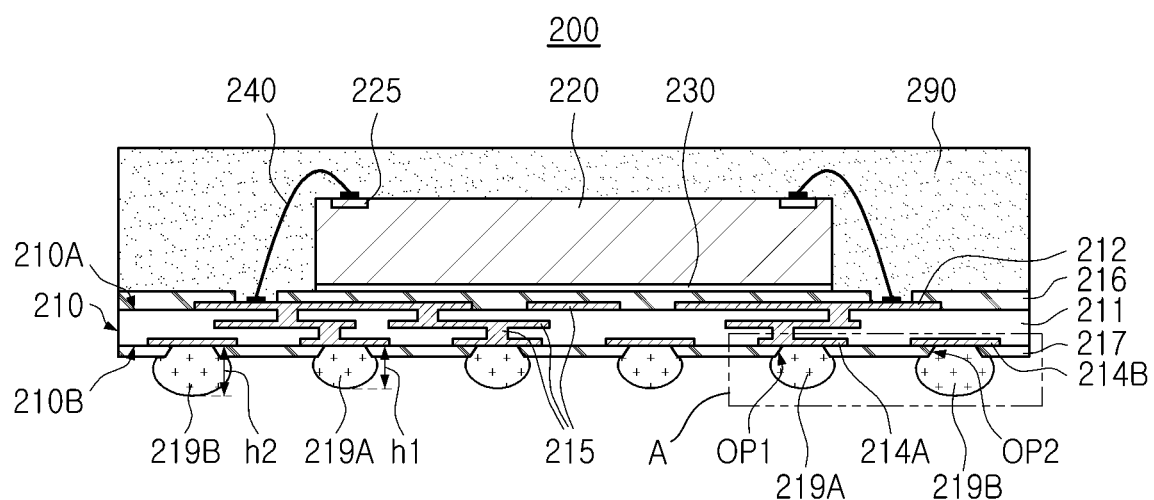
FIG. 1 is a side cross-sectional view of a semiconductor package according to an embodiment of the present inventive concept.
Figure 2:
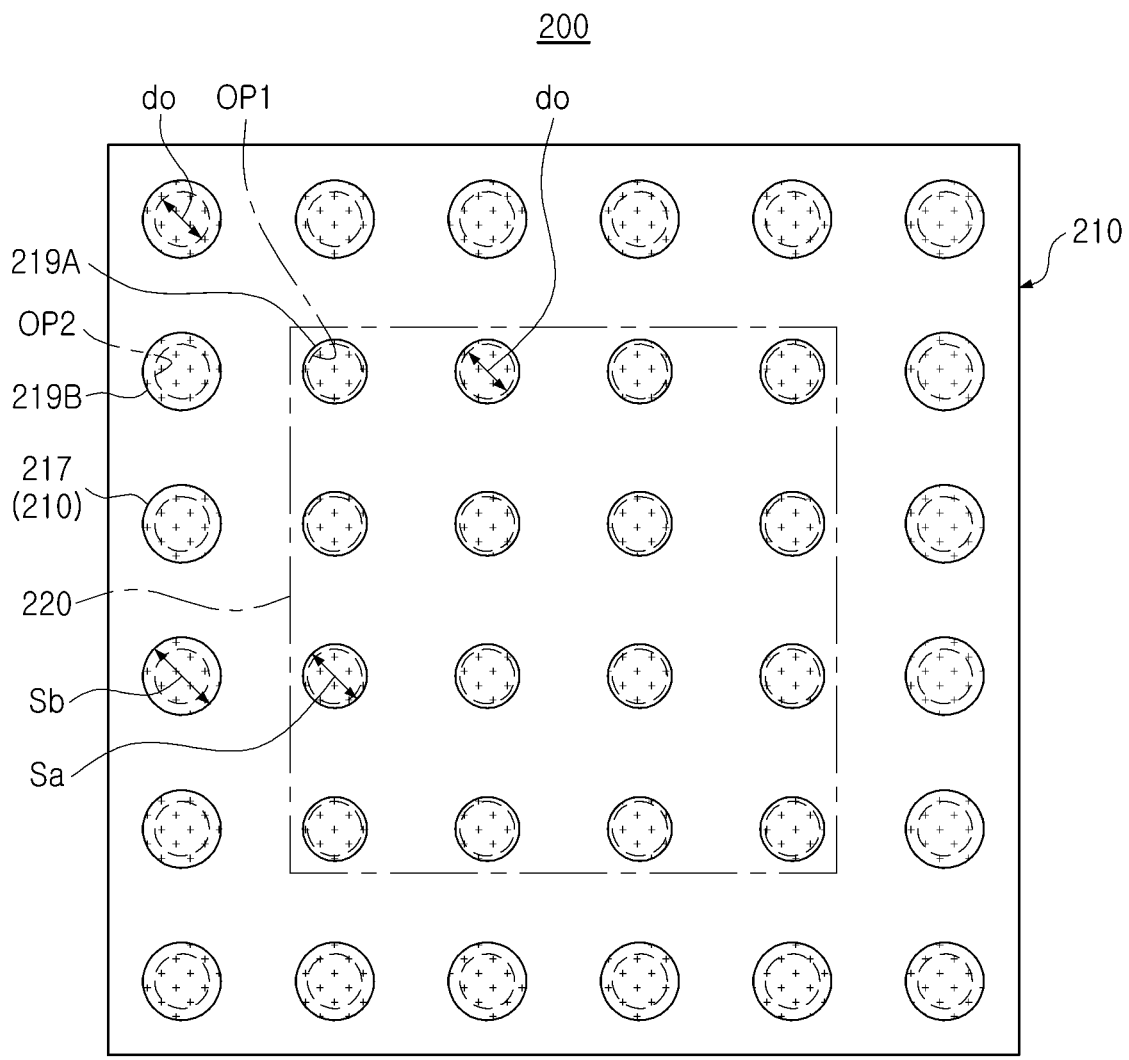
FIG. 2 is a bottom view illustrating the semiconductor package illustrated in FIG. 1.

FIG. 1 is a side cross-sectional view of a semiconductor package according to an embodiment of the present inventive concept, and FIG. 2 is a bottom view illustrating the semiconductor package illustrated in FIG. 1.

Referring to FIGS. 1 and 2, a semiconductor package 200 according to the present embodiment includes a base substrate 210 and a semiconductor chip 220 mounted on the base substrate 210.

The base substrate 210 may include a substrate body 211 in which a plurality of insulating layers are stacked and an interconnection circuit 215 having conductive vias and conductive patterns formed on the respective insulating layers. The base substrate 210 may include a plurality of upper pads 212 disposed on an upper surface 210A of the substrate body 211 and a plurality of first and second lower pads 214A and 214B disposed on a lower surface 210B of the substrate body 211. The interconnection circuit 215 may electrically connect the plurality of upper pads 212 to the plurality of first and second lower pads 214A and 214B.

As used herein, components described as being "electrically connected" are configured such that an electrical signal can be transferred from one component to the other (although such electrical signal may be attenuated in strength as it transferred and may be selectively transferred).

In some embodiments, the substrate body 211 may include or be formed of a resin-based insulating layer, such as an epoxy resin, a Bakelite resin, a paper epoxy, a glass epoxy, and the like. The interconnection circuit 215 may be formed of gold (Au), silver (Ag), platinum (Pt), aluminum (Al), copper (Cu), or the like. For example, the base substrate 210 may include or may be a printed circuit board (PCB). In another embodiment, the base substrate 210 may be a redistribution substrate having a circuit pattern. The substrate body 211 may include or be formed of an inorganic insulating layer such as silicon oxide or silicon nitride and/or a photosensitive organic insulating material such as a photoimageable dielectric (PID).

First and second solder resist layers 216 and 217 are respectively disposed on the upper surface 210A and the lower surface 210B of the base substrate 210. The first solder resist layer 216 may have a plurality of openings exposing a region of each of the plurality of upper pads 212. Similarly, the second solder resist layer 217 has a plurality of first and second openings OP1 and OP2 exposing a region of each of the plurality of first and second lower pads 214A and 214B.

In the present embodiment, the plurality of first and second openings OP1 and OP2 have substantially the same size. Here, the term "substantially" is used to include a difference in size made due to a manufacturing process, etc. For example, terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise. The regions of the plurality of first and second lower pads 214A and 214B exposed by the first and second openings OP1 and OP2 having substantially the same size may have substantially the same size as indicated by "do" having the same diameter (see FIG. 2).

The plurality of first and second external connection conductors 219A and 219B may be disposed in the exposed regions of the plurality of first and second lower pads 214A and 214B, respectively. The semiconductor package 200 may be electrically connected to an external system by the plurality of first and second external connection conductors 219A and 219B. The plurality of first and second external connection conductors 219A and 219B may have a shape obtainable through a reflow process, for example, a spherical shape or a substantially spherical shape (e.g., an elliptical sphere). The plurality of first and second external connection conductors 219A and 219B are formed in pad regions having the same diameter "do", but a size Sb of the second external connection conductors 219B may be greater than a size Sa of the first external connection conductor 219A (see FIG. 2).

For example, the plurality of first external connection conductors 219A may have a first height h1, and the plurality of second external connection conductors 219B may have a second height h2 greater than the first height h1. Each of the plurality of second external connection conductors 219B has a second volume greater than a first volume of each of the plurality of first external connection conductors 219A, but since the plurality of second external connection conductors 219B are respectively disposed in exposed regions having the same area as that of each of the first external connection conductors 219A, the second height h2 of the plurality of second external connection conductors 219B may be greater than the first height h1 of the plurality of first external connection conductors 219A.

In the present embodiment, each of the plurality of second external connection conductors 219B may be formed to have a relatively large volume and a relatively large height by applying a plurality of solder balls having the same size to the same pad region and then merging the plurality of solder balls through a reflow process (see FIGS. 3 to 8). Accordingly, the second volume of each of the plurality of second external connection conductors 219B may be substantially an integer multiple of the first volume. Since the plurality of second external connection conductors 219B are also formed in the same size of exposed pad regions as the first external connection conductors 219A, it may be difficult to apply an excessively larger number of the solder balls than those for one first external connection conductor 219A. Accordingly, the second volume of each of the plurality of second external connection conductors 219B may be double or triple the first volume.

As such, even if warpage occurs in the semiconductor package 200, the semiconductor package may be stably mounted on an external device having a flat top surface (e.g., a motherboard) using a height deviation of the plurality of first and second external connection conductors 219A and 219B.

As illustrated in FIG. 2, in the present embodiment, a plurality of second external connection conductors 219B (or the second lower pad 214B) are disposed in a region adjacent to an edge of the base substrate 210, and the plurality of first external connection conductors 219A (or the first lower pad 214A) may be disposed in an inner region of the lower surface of the base substrate 210.

In the present embodiment, the plurality of second external connection conductors 219B are arranged to surround an outer periphery of the first external connection conductor 219A, but the present inventive concept is not limited thereto and the plurality of second external connection connectors 219B may be arranged in various manners depending on the warpage shape of the semiconductor package, according to shapes of warpage of the semiconductor package (see FIGS. 9 to 12).

In order to adjust a gap deviation caused by warpage, the height h2 of the plurality of second external connection conductors 219B may be 10% to 40% greater than the first height h1. In another aspect, the second height h2 of the plurality of second external connection conductors 219B may be at least 10 μm greater than the first height h1.

The plurality of first and second external connection conductors 219A and 219B may each include or be formed of a eutectic metal such as a solder ball. For example, the solder ball may include or be formed of at least one of tin (Sn), lead (Pb), nickel (Ni), gold (Au), silver (Ag), copper (Cu), bismuth (Bi), and combinations thereof, and may be formed by a soldering device.

The semiconductor chip 220 may include, for example, silicon (Si), but is not limited thereto, and the semiconductor chip 220 may include a semiconductor element such as germanium (Ge) or a compound semiconductor such as silicon carbide (SiC), gallium arsenide (GaAs), indium arsenide (InAs), and indium phosphide (InP). Alternatively, the semiconductor chip 220 may have a silicon on insulator (SOI) structure. For example, the semiconductor chip 220 may include a buried oxide layer (BOX). The semiconductor chip 220 may include a conductive region, for example, a well doped with an impurity or a structure doped with an impurity. For example, the semiconductor chip 220 may have various device isolation structures such as a shallow trench isolation (STI) structure.

The semiconductor chip 220 may include or may be a system LSI, flash memory, DRAM, SRAM, EEPROM, PRAM, MRAM, or RRAM. For example, the semiconductor chip 220 may include a plurality of various types of individual devices. The plurality of various types of individual devices may include or may be various microelectronic devices, for example, a metal-oxide-semiconductor field effect transistor (MOSFET) such as a complementary metal-insulator-semiconductor transistor (CMOS), a system large scale integration (LSI), an image sensor such as a CMOS imaging sensor (CIS), a micro-electro-mechanical system (MEMS), an active device, a passive device, and the like. The plurality of various types of individual devices may be electrically connected to the conductive region. The semiconductor package 200 may include at least two of the plurality of individual devices and/or a conductive wiring and/or a conductive plug electrically connecting the plurality of individual devices to the conductive region. Also, each of the plurality of individual devices may be electrically isolated/insulated from other adjacent individual devices by insulating layers.

The semiconductor chip 220 may include a plurality of interconnection structures for connecting the plurality of individual devices to other interconnections. The plurality of interconnection structures may include a metal interconnection layer and a via plug. The metal interconnection layer and the via plug may include a barrier layer for interconnection and a metal layer for interconnection. The barrier layer for interconnection may include or be formed of at least one material selected from Ti, TiN, Ta, and TaN. The metal layer for interconnection may include or be formed of at least one metal selected from W, Al, and Cu.

The semiconductor chip 220 may be electrically connected to the upper pad 212 of the base substrate 210 by a bonding wire 240. The semiconductor chip 220 may be mounted on the first solder resist layer 216 using a die attach film 230.

A mold portion 290 may be formed on the upper surface 201A of the base substrate 210, e.g., on the first solder resist layer 216. The mold portion 290 may be formed on the upper surface 210A of the base substrate 210, e.g., on the first solder resist layer 216, to surround the semiconductor chip 220 and the bonding wire 240. The mold portion 290 may be formed of resin. The mold portion 290 may include or be formed of, for example, epoxy mold compound (EMC).

FIGS. 3 to 8 are cross-sectional views illustrating respective steps of process of forming external connection conductors 219A and 219B of the semiconductor package illustrated in FIG. 1. The cross-sectional views may be understood as a region corresponding to a portion A of FIG. 1.

Figure 3:
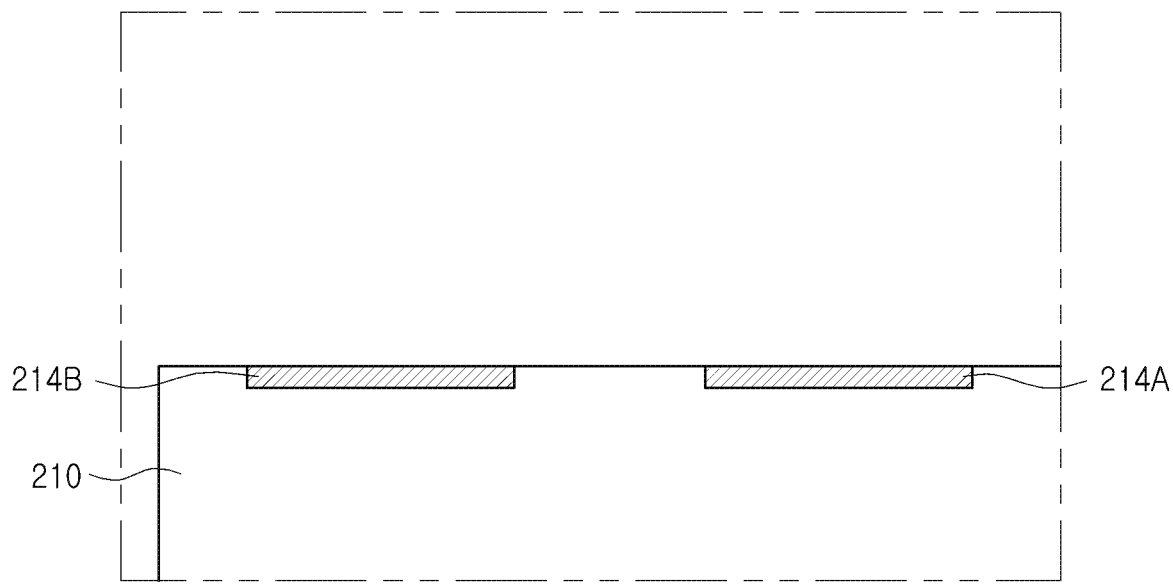
FIGS. 3 to 8 are cross-sectional views illustrating respective steps of a process of forming an external connection conductor of the semiconductor package illustrated in FIG. 1.

Referring to FIG. 3, a partial region of the base substrate 210, e.g., a lower surface in which the first and second lower pads 214A and 214B are arranged is illustrated.

An interconnection circuit (not shown, see 215 of FIG. 1) including a conductive pattern and a conductive via may be included in the base substrate 210. The interconnection circuit 215 may include an upper surface pad 212 and first and second lower surface pads 214A and 214B.

Figure 4:
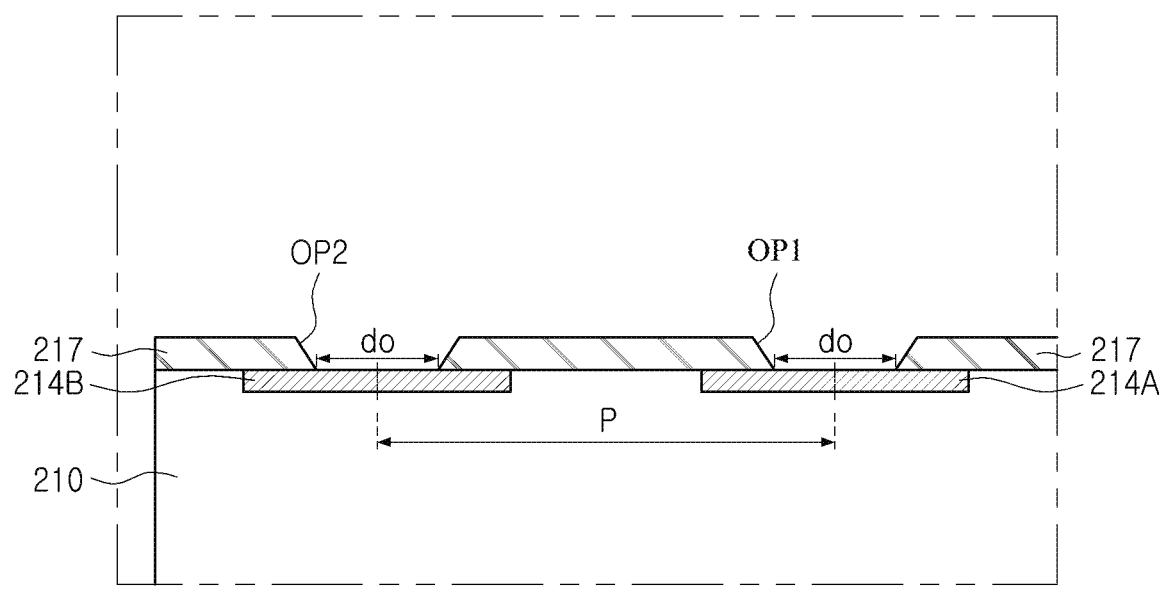

Next, referring to FIG. 4, a second solder resist layer 217 in which first and second openings OP1 and OP2 are formed may be formed.

The second solder resist layer 217 may be formed by applying, for example, a photoimageable solder resist material on the entire lower surface of the base substrate 210 by a screen-printing method or a spray coating method, or by bonding a film type solder resist material by a laminating method.

The first and second openings OP1 and OP2 may be formed to have the same size "do". The second solder resist layer 217 formed on the lower surface of the base substrate 210 may be formed by removing portions corresponding to the first and second openings OP1 and OP2 by exposure and development and curing the portions with heat, UV or IR. The opening forming process is not limited thereto, and other processes such as laser processing may be used.

Figure 5:
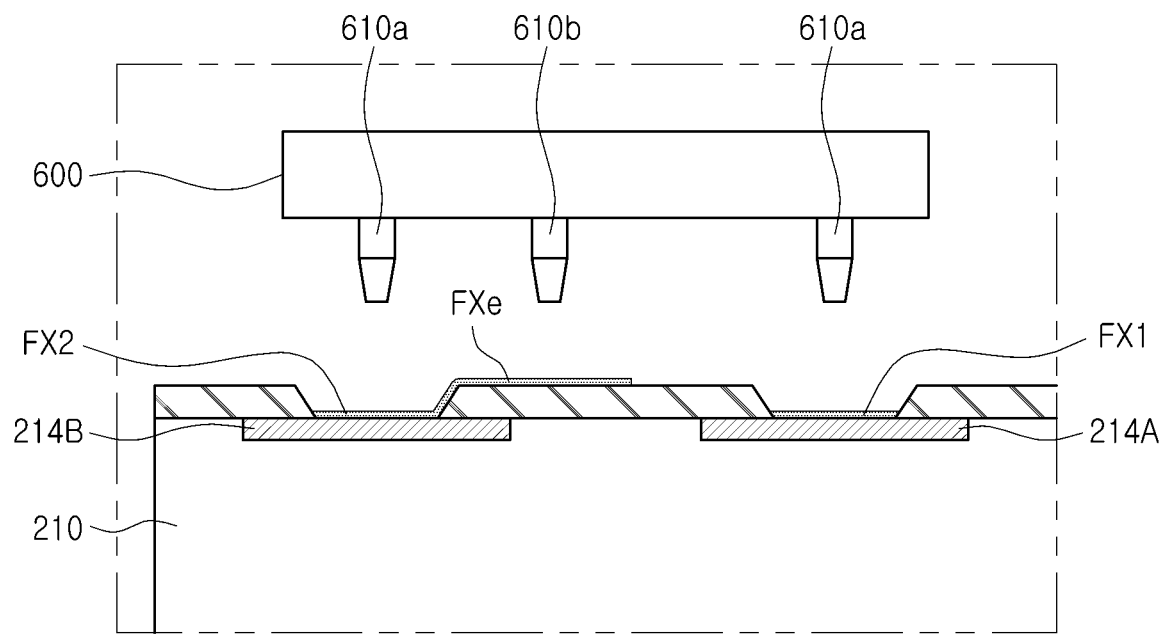

Next, referring to FIG. 5, a flux layer FXe may be applied to a solder resist region adjacent to the second opening OP2 together with the pad region exposed by the first and second openings OP1 and OP2 using a flux supply device 600.

The flux layer is applied to a region in which a solder ball is to be disposed using the flux supply device 600. In the present embodiment, first and second flux layers FX1 and FX2 are formed in the pad regions exposed by the first and second openings OP1 and OP2, and an extension flux layer FXe is additionally applied to a solder resist region adjacent to the second opening OP2. The extension flux layer FXe may be a region extending from the second flux layer FX2, but is not limited thereto, and the second flux layer FX2 and the extension flux layer FXe may be disposed to be spaced apart from each other within a range in which solder balls to be disposed in a subsequent process may be merged. Such flux improves spreadability and wettability of the solder, and the flux may be pre-applied to the region to be soldered or included in a non-conductive film (e.g., in the second solder resist layer 217). By forming the expansion flux layer FXe, solder balls may be stably disposed in the solder resist region adjacent to the second opening OP2. For example, the flux may be classified as a resin-based, organic-based, and inorganic-based flux, and the flux used in an electronic device may be a resin-based flux.

According to the present embodiment, in order to form an external connection conductor having a different size or height, flux may be applied to desired regions as shown in FIG. 5 through a simple modification of installing a new inlet 610b in addition to an existing inlet 610a in the flux supply device 600, without having to change the design of the first and second pads 214A and 214B and/or the first and second openings OP1 and OP2. However, the present inventive concept is not limited thereto, and, in some embodiments, after the first and second flux layers FX1 and FX2 are applied to the pad regions of the first and second openings OP1 and OP2, the extension flux layer FXe may be additionally formed in the solder resist region adjacent to the second opening OP2 by moving the inlet of some fluxes.

Figure 6:
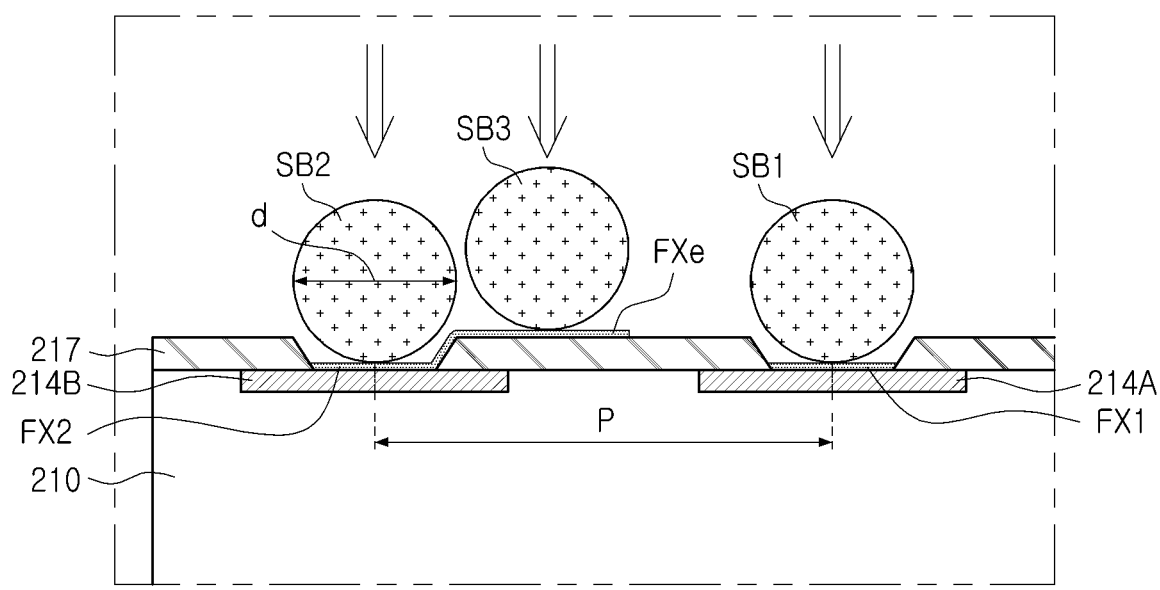

Next, referring to FIG. 6, first to third solder balls SB1, SB2, and SB3 may be applied to the first and second flux layers FX1 and FX2 and the extension flux layer FXe, respectively.

The first to third solder balls SB1, SB2, and SB3 having the same size d may be disposed on the flux layers FX1, FX2, and FXe described above with reference to FIG. 5. The first and second solder balls SB1 and SB2 may be disposed on the first and second flux layers FX1 and FX2 positioned in the first and second openings OP1 and OP2, respectively, and the third solder ball SB3 may also be disposed on the solder resist region adjacent to the second solder ball SB2 with the flux layer FXe. As described above, the first and second solder balls SB1 and SB2 may be respectively disposed in the regions exposed by the first and second openings OP1 and OP2, and the third solder ball SB3 may be disposed in a region adjacent to the second opening OP2.

While the third solder ball SB3 is disposed adjacent to the second solder ball SB2, a sufficient distance to the first solder ball SB1 may be secured so as not to be merged with the first solder ball SB1 in the reflow process. Accordingly, the first and second lower pads 214A and 214B may be arranged at a pitch of three or more times the diameter d of each solder ball. In view of a final structure, the diameter d of each solder ball is similar to or the same as a width of the first external connection conductor 219A formed of one solder ball, so a pitch of the first and second lower pads 214A and 214B may be defined as more than three times the width of the first external connection conductor 219A.

Next, the first to third solder balls SB1, SB2, and SB3 may be melted using a reflow device to form the first and second external connection conductors 219A and 219B having desired shapes. For example, the reflow device may melt the first to third solder balls SB1, SB2, and SB3 by heating the solder balls SB1, SB2 and SB3 in a heating chamber, while conveying the base substrate 210 by a conveyor or the like.

Figure 7:
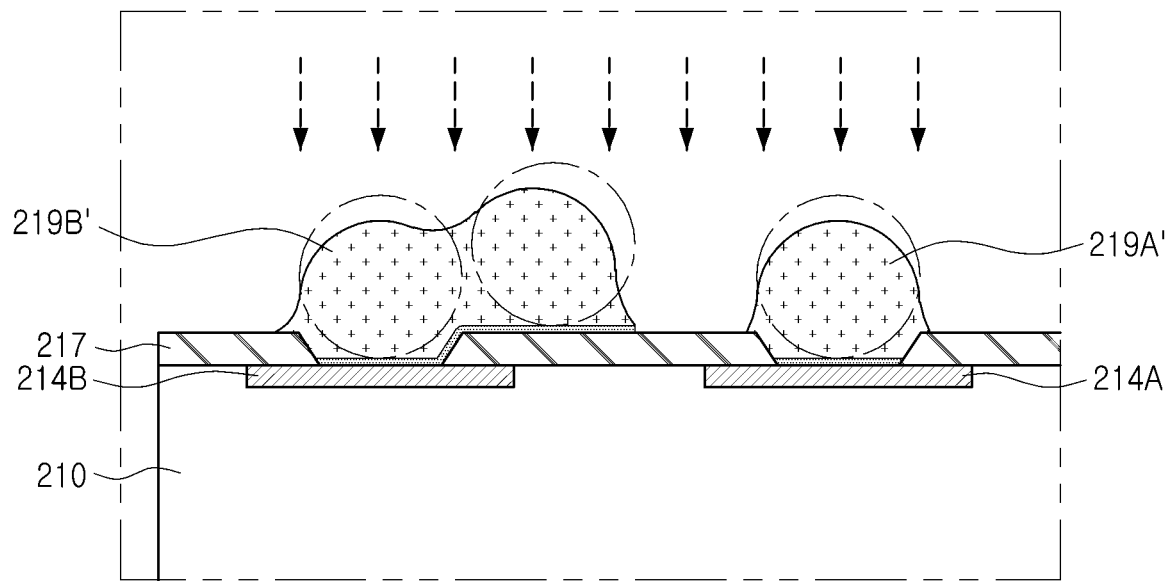
Figure 8:
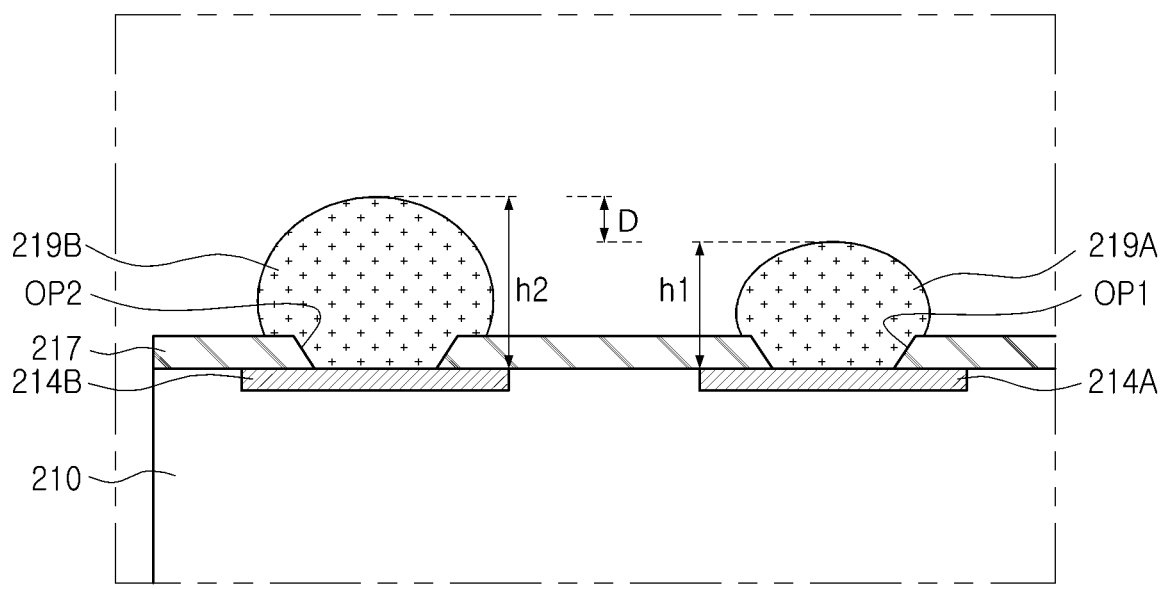

First, referring to FIG. 7, the first to third solder balls are melted through the reflow device, and the molten solder balls SB1, SB2, and SB3 may be in close contact with the pad regions and the spherical connection conductors 219A' and 219B' may be deformed by surface tension. In this process, adjacent second and third solder balls SB2 and SB3 may be merged. The merged second and third solder balls SB2 and SB3 may form the second external connection conductor 219B in a region exposed to the second opening OP2 as illustrated in FIG. 8.

As such, since the second external connection conductor 219B is formed by the two solder balls SB2 and SB3, the second external connection conductor 219B may have twice the volume of the first external connection conductor 219A. In addition, since the second external connection conductor 219B has twice the volume and is formed in the pad region having the same area as the first external connection conductor 219A, the second external connection conductor 219B may be formed to have a height greater than the height of the first external connection conductor 219A. Although there are some differences depending on the shapes of the first and second external connection conductors 219A and 219B, a height h2 of the second external connection conductor 219B may be about 10% to 40% greater than a first height h1. In another aspect, a deviation of a substrate level due to a curvature of the warpage may be compensated for using a deviation D of the first and second heights. As for the deviation D, the second height h2 of the second external connection conductor 219B may be at least 10 µm greater than the first height h1. For example, a difference between a highest level and a lowest level of the lower surface 210B of the base substrate 210 may be 20 µm or more.

As used herein, a "level" may be a vertical distance from a horizontal reference plane. Spatially relative terms, such as "level," "beneath," "below," "lower," "above," "upper" and the like, may be used herein for ease of description to describe positional relationships. It will be understood that the spatially relative terms encompass different orientations of the device in addition to the orientation depicted in the figures.

The external connection conductor for gap adjustment (i.e., the second external connection conductor) having a height greater than that of other external connection conductors may be easily applied to semiconductor packages having various structures. In addition, since the external connection conductor for gap adjustment may be easily arranged in a desired region of the substrate, a deviation of the substrate level (e.g., a gap between the semiconductor package and the substrate) due to various types of warpage may be effectively compensated. These various embodiments will be described with reference to FIGS. 9 to 13.

Figure 9:
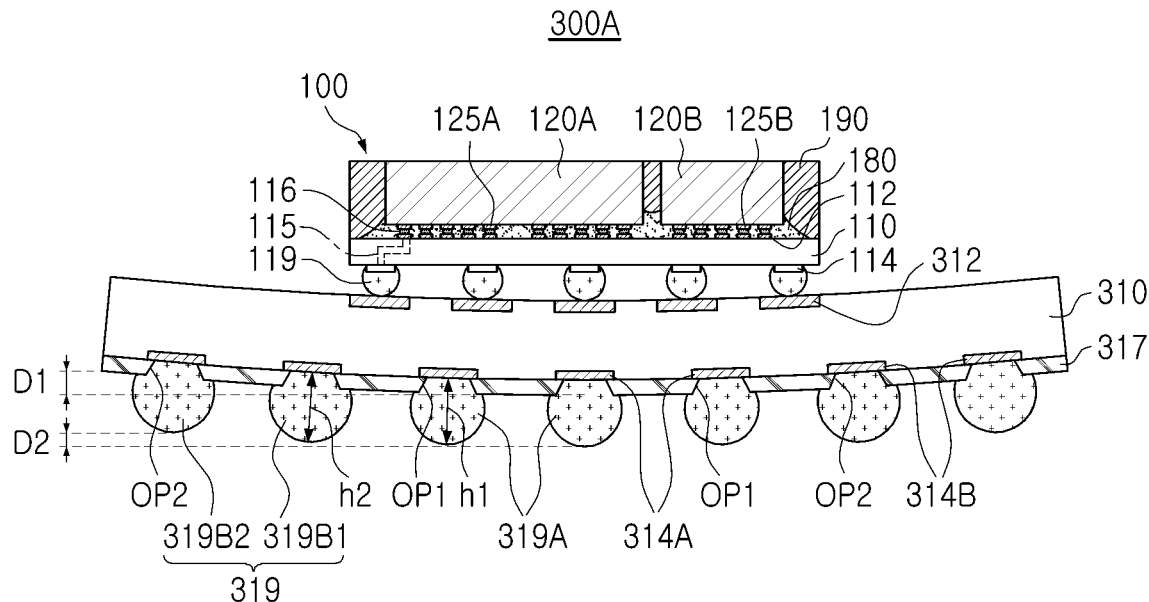
FIGS. 9 and 10 are side cross-sectional views of semiconductor packages according to various embodiments of the present inventive concept, respectively.
Figure 10:
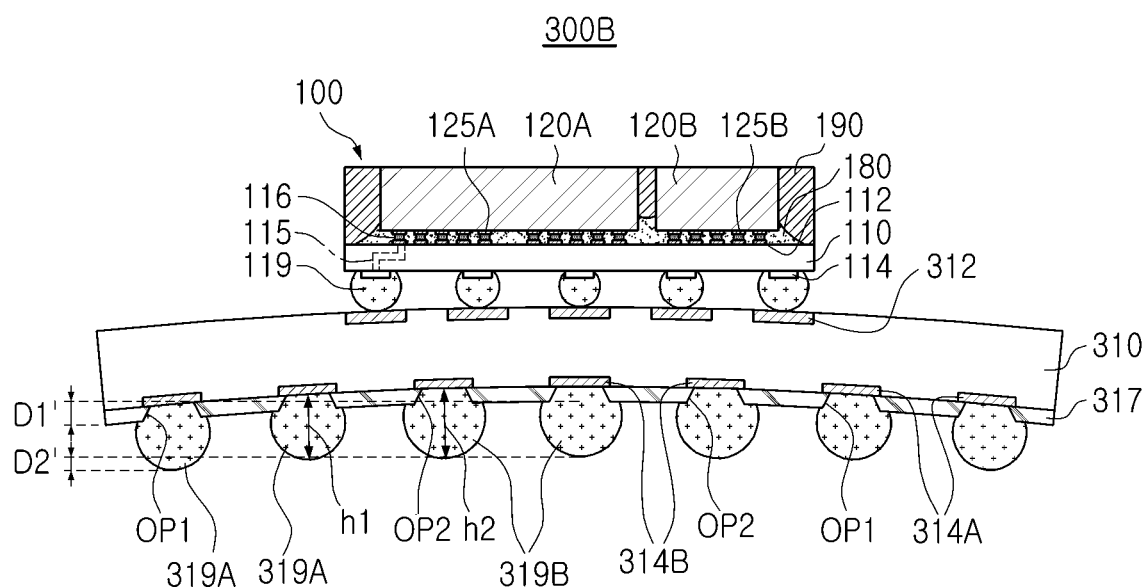

FIGS. 9 and 10 are side cross-sectional views of semiconductor packages according to various embodiments of the present inventive concept, respectively.

Referring to FIG. 9, a semiconductor package 300A according to the present embodiment includes a base substrate 310, an interposer 110 mounted on the base substrate 310, and first and second semiconductor chips 120A and 120B mounted on the interposer 110.

Similar to the base substrate 210 illustrated in FIG. 1, the base substrate 310 may include a plurality of upper pads 312, a plurality of first and second lower pads 314A and 314B, and an interconnection circuit (not shown), and an interconnection circuit may electrically connect the plurality of upper pads 312 and the plurality of first and second lower pads 314A and 314B. For example, the base substrate 310 may include or may be a printed circuit board (PCB).

The interposer 110 may be disposed on an upper surface of the base substrate 310 and may include a plurality of lower connection pads 114 respectively and electrically connected to the plurality of upper pads 312 and a plurality of upper connection pads 112 electrically connected the plurality of lower connection pads 114. The interposer 110 may include a substrate having a redistribution layer, and the substrate may be formed of, for example, a semiconductor substrate (e.g., a silicon substrate), an inorganic insulating layer, or a photosensitive organic insulating layer such as PID.

The first and second semiconductor chips 120A and 120B may be disposed on an upper surface of the interposer and may be electrically connected to a plurality of upper connection pads 112, respectively. In some embodiments, the first semiconductor chip 120A may include or may be a logic chip. For example, the first semiconductor chip 120A may include or may be a controller or a microprocessor including a logic device. In some embodiments, the second semiconductor chip 120B may include or may be a memory chip such as a DRAM, an SRAM, a flash, a PRAM, a ReRAM, a FeRAM, or an MRAM (FeRAM). For example, the second semiconductor chip 120B may be a high-band memory (HBD) chip including a memory stack electrically connected through a TSV structure.

The first and second semiconductor chips 120A and 120B may each have an active surface facing the first surface of the interposer 110 and an inactive surface (i.e., upper surface) positioned opposite to the active surface. The first and second semiconductor chips 120A and 120B may include a plurality of connection electrodes 125A and 125B respectively disposed on the active surfaces. The connection electrodes 125A and 125B of the first and second semiconductor chips 120A and 120B may be electrically connected to the first upper connection pads 112 of the interposer 110 by connection bumps 116.

An underfill 180 may be disposed between an upper surface of the interposer substrate 110 and the first and second semiconductor chips 120A and 120B. The underfill 180 may fill a space between the plurality of bumps 116. The underfill 180 may protect the plurality of upper pads 112, the plurality of connection bumps 116, and active surfaces of the first and second semiconductor chips 120A and 120B from the outside. For example, the underfill 180 may include or be formed of an insulating polymer material such as an epoxy resin.

The molding portion 190 may be disposed on the upper surface of the interposer 110 and have a structure surrounding the first and second semiconductor chips 120A and 120B. The molding portion 190 may include or be formed of an insulating polymer material similar to the underfill 180. For example, the molding portion 190 may be formed of an epoxy resin or EMC. The upper surfaces of the first and second semiconductor chips 120A and 120B may be exposed from an upper surface of the molding portion 190 and may form a flat coplanar surface with each other.

The base substrate 310 employed in the present embodiment may improve warpage of the semiconductor package 300A using a height deviation of the plurality of first and second external connection conductors 319A and 319B.

The base substrate 310 illustrated in FIG. 9 may be deformed such that a center thereof has a lower level than an edge region of the base substrate 310 and a region adjacent to an edge has a higher level than the center of the base substrate 310. Due to the warpage, the base substrate 310 has a level deviation D1, and in order to compensate for this deviation, an external connection conductor (i.e., a second external connection conductor 319B) having a relatively large height is disposed in a region adjacent to the edge.

For example, a solder resist layer 317 is disposed on a lower surface of the base substrate 310, and a plurality of first and second openings OP1 and OP2 respectively opening the plurality of first and second lower pads 314A and 314B are formed in the solder resist layer 317. The plurality of first and second openings OP1 and OP2 have substantially the same size. Exposed regions of the plurality of first and second lower pads 314A and 314B by the first and second openings OP1 and OP2 having substantially the same size may also have substantially the same size. In the present embodiment, the second lower pads 314B may be arranged in two rows in a region adjacent to the edge of the lower surface of the base substrate 310. For example, the second lower pads 314B may be disposed in two rows along the edge of the lower surface of the base substrate 310.

The plurality of first and second external connection conductors 319A and 319B may be disposed on exposed regions of the plurality of first and second lower pads 314A and 314B, respectively. Even if the plurality of second external connection conductors 319B have a second volume larger than the first volume of the plurality of first external connection conductors 319A, since the plurality of second external connection conductors 319B are respectively disposed in the exposed regions having the same area as those of the first external connection conductors 319A, a second height h2 of the plurality of second external connection conductors 319B may be greater than a first height h1 of the plurality of first external connection conductors 319A. In the present embodiment, the second external connection conductors 319B may be arranged in two rows 319B1 and 319B2 in a region adjacent to the edge of the lower surface of the base substrate 310. For example, the height h2 of the second external connection conductors 319B may be 10% to 40% greater than the first height h1 of the first external connection conductors 319A.

In this manner, the deviation D1 of the substrate level due to warpage of the semiconductor package 300A may be reduced by the deviation D2 of the actual level during mounting using a height deviation (h2−h1) of the plurality of first and second external connection conductors 319A and 319B. As in the present embodiment, the second external connection conductors 319B may be arranged in two or more rows according to the degree of bending.

Referring to FIG. 10, the semiconductor package 300B according to the present embodiment may be understood as being similar to or the same as the semiconductor package 300A illustrated in FIG. 9, except that a bent direction of the base substrate 310 thereof is the opposite to that of the base substrate 310 of the semiconductor package 300A and an arrangement of the first and second external connection conductors 319A and 319B is different. The description of the components of the present embodiment may refer to the description of the same or similar components of the semiconductor package 300A illustrated in FIG. 9 unless otherwise specified.

The base substrate 310 illustrated in FIG. 10 is deformed such that a region adjacent to the edge has a lower level than a central region and a central region has a higher level than an edge of the base substrate 310. Due to the warpage, a deviation D1' occurs in the level of the base substrate 310, and in order to compensate for the deviation D1' of the substrate level, an external connection conductor (i.e., a second external connection conductor 319B) having a relatively large height is disposed in the central region.

For example, by arranging the second external connection conductor 319B having a relatively large height in the center and on both sides of the center and forming the first external connection conductor 319A having a relatively low height in the remaining region, deviation D1' of the substrate level may be reduced. For example, the deviation D1' of the substrate level may be reduced to a deviation D2', e.g., in view of bottom levels of the external connection conductors 319, during mounting of the semiconductor package 300B using a height deviation h2−h1 of the plurality of first and second external connection conductors 319A and 319B.

Figure 11:
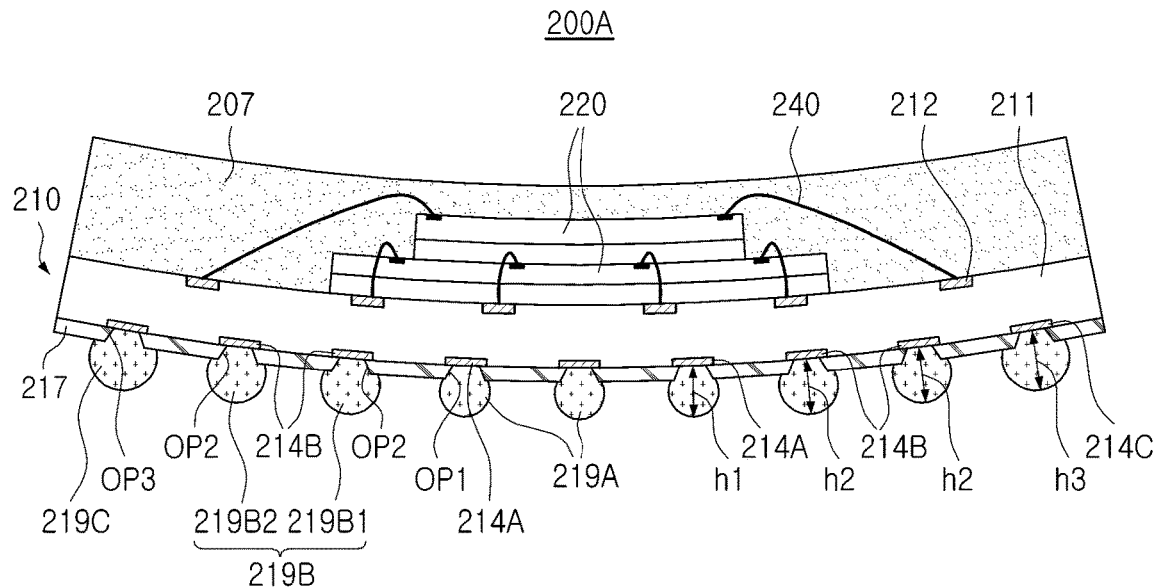
FIGS. 11 and 12 are side cross-sectional views of semiconductor packages according to various embodiments of the present inventive concept, respectively.
Figure 12:
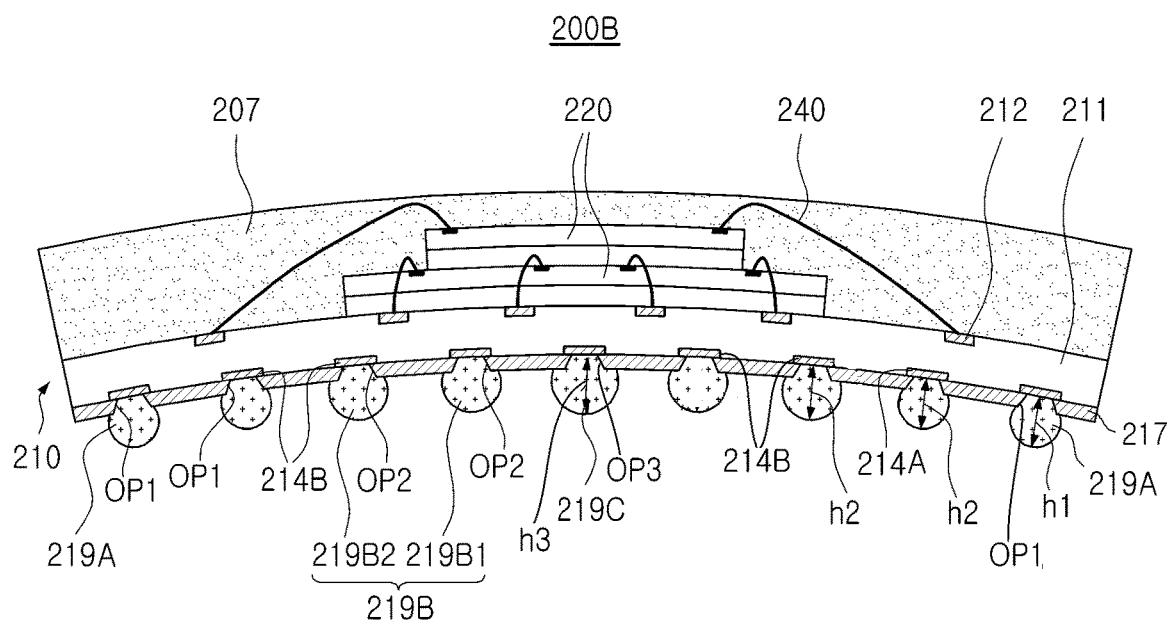

FIGS. 11 and 12 are side cross-sectional views of semiconductor packages according to various embodiments of the present inventive concept, respectively.

Referring to FIG. 11, a semiconductor package 200A according to the present embodiment may be understood to be similar to or the same as the semiconductor package 200 illustrated in FIGS. 1 and 2, except that a plurality of semiconductor chips 220 are stacked on the base substrate 210 and that three types of external connection conductors 219A, 219B, and 219C having different heights are employed to compensate bending of the base substrate. The description of the components of the present embodiment may refer to the descriptions of the same or similar components of the semiconductor package 200 illustrated in FIGS. 1 and 2, unless otherwise specified.

The semiconductor package 200A according to the present embodiment may include a plurality of stacked semiconductor chips 220 disposed on the base substrate 210. As described above, the semiconductor package 200A according to the present embodiment may employ various types of semiconductor chips.

The base substrate 210 illustrated in FIG. 11 is deformed such that a center thereof has a lower level than an edge region of the base substrate 210 and a region adjacent to the edge has a higher level than the center of the base substrate 210.

In the present embodiment, three types of external connection conductors 219A, 219B, and 219C having different heights may be employed depending on the bending positons of the base substrate 210, and level differences of the substrate may be compensated more precisely than the ones in the previous embodiment. In order to compensate for a level deviation of the base substrate 210 due to the warpage, a first external connection conductor 219A having a first height h1 is disposed in a central region, and a third external connection conductor 219C having a third height h3 is disposed in a region closest to the edge. Also, a second external connection conductor 219B having a second height h2, an intermediate height, may be disposed between the first external connection conductor 219A and the third external connection conductor 219B. For example, the third height h3 may be greater than the second height h2, and the second height h2 may be greater than the first height h1. If necessary, some external connection conductors may be arranged in multiple rows. In the present embodiment, first and second external connection conductors 219A and 219B may be arranged in a plurality of columns (e.g., two columns).

For example, a solder resist layer 217 is disposed on a lower surface of the base substrate 210, and a plurality of first to third openings OP1, OP2, and OP3 opening respective regions of a plurality of first to third lower pads 214A to 214C is formed in the solder resist layer 217. The plurality of first to third openings OP1, OP2, and OP3 have substantially the same size. The plurality of first to third external connection conductors 219A, 219B, and 219C may be respectively disposed on exposed regions of the plurality of first to third lower pads 214A, 214B, and 214C. As described in the previous process (see FIGS. 5 to 9), the plurality of first to third external connection conductors 219A, 219B, and 219C may be formed by adjusting the number of solder balls having the same size. For example, the first external connection conductor 219A may be formed of one solder ball, the second external connection conductor 219B may be formed of two solder balls, and the third external connection conductor 219C may be formed of three solder balls to secure respective desired heights.

In this manner, a deviation of the substrate level due to warpage of the semiconductor package 200A may be gradually reduced using the height deviations of the plurality of first to third external connection conductors 219A, 219B, and 219C. For example, in the present embodiment, by employing the first to third external connection conductors 219A, 219B, and 219C having different heights, level differences of the substrate may be more precisely compensated than the ones in the previous embodiments.

Referring to FIG. 12, a semiconductor package 200B according to the present embodiment may be understood as being similar to or the same as the semiconductor package 200A illustrated in FIG. 11, except that a bending direction of the base substrate 210 is opposite to bending direction of the base substrate 210 of the semiconductor package 200A and that an arrangement of the first to third external connection conductors 219A, 219B, and 219C is different. The description of the components of the present embodiment may refer to the description of the same or similar components of the semiconductor package 200A illustrated in FIG. 11 unless otherwise specified.

The base substrate 210 illustrated in FIG. 12 is deformed such that a region adjacent to the edge has a lower level than a center of the base substrate 210 and a central region has a higher level than an edge of the base substrate 210. In order to compensate for the level deviation of the base substrate 210 due to the warpage, a third external connection conductor 219C having a relatively large third height is disposed in the central region and a first external connection conductor 219A having the smallest height h1 is disposed in the region closest to the edge. Also, a second external connection conductor 219B having a second height h2, an intermediate height, may be disposed between the first external connection conductor 219A and the third external connection conductor 219B. For example, the third height h3 may be greater than the second height h2, and the second height h2 may be greater than the first height h1. In the present embodiment, first and second external connection conductors 219A and 219B may be arranged in a plurality of columns (e.g., two columns). For example, two or more columns of first external connection conductors 219A may be arranged along an edge of the base substrate 210, and two or more columns of second external connection conductors 219B may be arranged between the first external connection conductors 219A and the third external connection conductor 219C.

As described above, the deviation of the substrate level may be more precisely compensated through the arrangement of the first to third external connection conductors 219A, 219B, and 219C having different heights.

Figure 13:
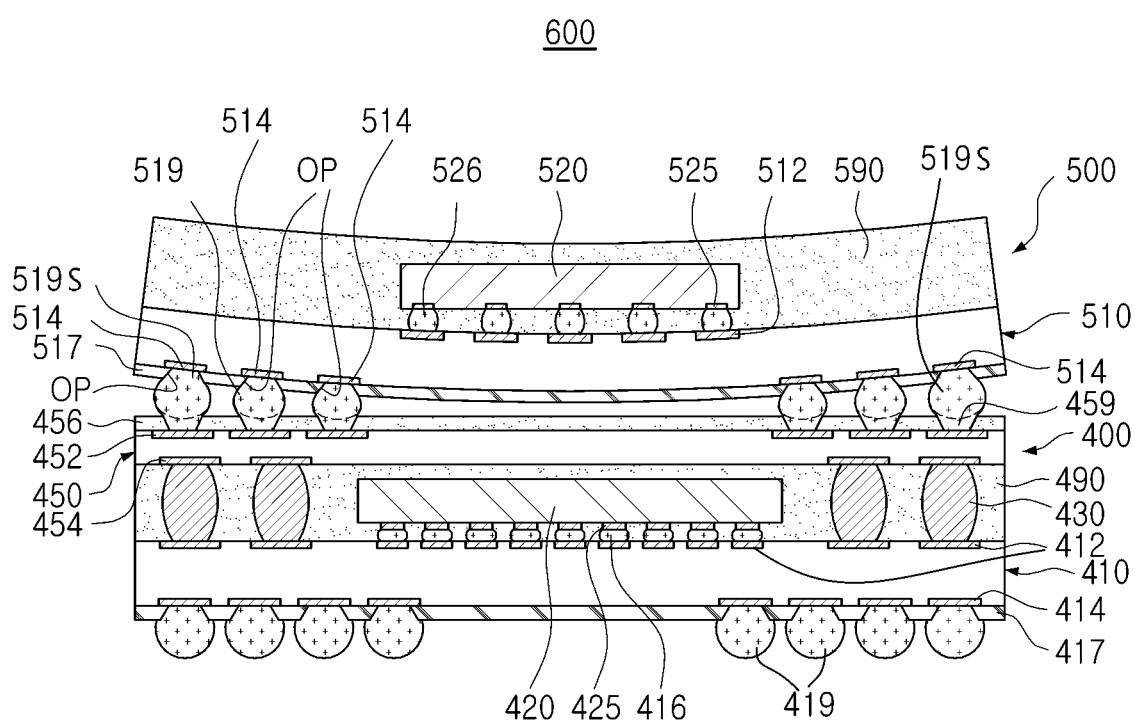
FIG. 13 is a side cross-sectional view of a POP-type semiconductor package according to an embodiment of the present inventive concept.

FIG. 13 is a side cross-sectional view of a POP-type semiconductor package according to an embodiment of the present inventive concept.

Referring to FIG. 13, a semiconductor package 600 according to the present embodiment may include a first semiconductor package 400, a second semiconductor package 500 disposed on the first semiconductor package 400, and an interposer 450 disposed between the first semiconductor package 400 and the second semiconductor package 500 and electrically connect the first and second semiconductor packages 400 and 500 to each other.

The first semiconductor package 400 may include a first substrate 410, a first semiconductor chip 420 on the first substrate 410, and a first molding portion 490 disposed on the first substrate to cover a first semiconductor chip 420.

The first substrate 410 may be a substrate for a package. For example, the first substrate 410 may be a printed circuit board or a ceramic substrate. The first substrate 410 may be formed of a single layer or multiple layers. The first substrate 410 may include an upper surface and a lower surface opposing each other. The first substrate 410 may include a first lower pad 414, a first upper pad 416, and an interconnection circuit (not shown). A first solder resist layer 417 including an opening exposing a partial region of the first lower pad 414 may be disposed on a lower surface of the first substrate 410. A first external connection conductor 419 may be disposed on an exposed region of the first lower pad 414. For example, a plurality of first external connection conductors 419 may be disposed on exposed regions of a plurality of first lower pads 414 respectively. The first external connection conductor 419 may electrically connect the first semiconductor package 400 to an external device.

The first semiconductor chip 420 may be mounted on the first substrate 410. In some embodiments, the first semiconductor chip 420 may be a non-memory semiconductor chip such as a logic semiconductor chip. For example, the first semiconductor chip 420 may be an application processor (AP). For convenience of description, it is illustrated that only a single semiconductor chip is formed on the first substrate 410, but the technical spirit of the present inventive concept is not limited thereto. For example, a plurality of semiconductor chips may be formed/mounted side by side on the first substrate 410, or a plurality of semiconductor chips may be sequentially stacked on the first substrate 410 (see FIGS. 11 and 12).

In the present embodiment, the first semiconductor chip 420 may be mounted on the first substrate 410 by a flip chip bonding method. For example, a first bump 416 may be interposed between the first substrate 410 and the first semiconductor chip 420 to electrically connect the first substrate 410 and the first semiconductor chip 420 to each other.

The interposer 450 may include an upper surface and a lower surface facing/opposite each other. The interposer 450 may reduce warpage of the semiconductor package 600 together with easy electrical connection between the first semiconductor package 400 and the second semiconductor package 500.

The interposer 450 may include a lower connection pad 454 and an upper connection pad 452. For example, the lower connection pad 454 may be disposed on a lower surface of the interposer 450, and the upper connection pad 452 may be disposed on an upper surface of the interposer 450. The lower connection pad 454 and the upper connection pad 452 may be electrically connected by an electrical interconnection circuit formed in the interposer 450, for example, an interconnection pattern and vias. A portion of the upper connection pad 452 may be exposed by an opening of the solder resist layer 456.

In some embodiments, the interposer 450 may be electrically connected to the first substrate 410 by a vertical connection member 430. The vertical connection member 430 may be disposed between the first substrate 410 and the interposer 450 to electrically connect the first substrate 410 and the interposer 450 to each other. In some embodiments, a plurality of vertical connection members 430 may be formed to surround the first semiconductor chip 420. For example, the vertical connection member 430 may include or be formed of tin (Sn), indium (In), bismuth (Bi), antimony (Sb), copper (Cu), silver (Ag), zinc (Zn), lead (Pb), and combinations thereof, but is not limited thereto.

Although the interposer 450 is illustrated to be spaced apart from the first semiconductor chip 420, the technical spirit of the present inventive concept is not limited thereto. For example, depending on a size of the vertical connection member 430, the interposer 450 may contact the first semiconductor chip 420.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The second semiconductor package 500 may include a second substrate 510 disposed on the interposer 450, a second semiconductor chip 520 on the second substrate 510, and a second molding portion 590 disposed on the second substrate 510 and surrounding the second semiconductor chip 520.

The second substrate 510 may be a substrate for a package. For example, the second substrate 510 may be a printed circuit board (PCB) or a ceramic substrate. The second substrate 510 may be formed of a single layer or multiple layers. The second substrate 510 may include an upper surface and a lower surface facing/opposite each other.

A plurality of second lower pads 514 and a plurality of second upper pads 512 may be disposed on a lower surface and an upper surface of the second substrate 510, respectively. The plurality of second lower pads 514 and the plurality of second upper pads 512 may be electrically connected by an electrical interconnection circuit in the second substrate 510, for example, an interconnection pattern and a conductive via. The second semiconductor chip 520 may be mounted on the second substrate 510. In some embodiments, the second semiconductor chip 520 may be a memory semiconductor chip.

For convenience of description, it is illustrated that only a single semiconductor chip is formed on the second substrate 520, but the technical spirit of the present inventive concept is not limited thereto. For example, a plurality of semiconductor chips may be formed/mounted side by side on the second substrate 510, or a plurality of semiconductor chips may be sequentially stacked on the second substrate 510 (see FIGS. 11 and 12).

The second semiconductor chip 520 may be mounted on the second substrate 510 by a plurality of second bumps 526. The plurality of second bumps 526 may be disposed between the second substrate 510 and the second semiconductor chip 520 to electrically connect the second substrate 510 and the second semiconductor chip 520 to each other.

The second semiconductor package 500 may include a second solder resist layer 517 disposed on a lower surface of the second substrate 510 and having a plurality of openings OP exposing partial regions of the plurality of second lower pads 514. The plurality of openings OP may have the same size, and exposed regions of the plurality of second lower pads 514 may also have substantially the same size. A plurality of second external connection conductors 519 may be respectively disposed on the exposed regions of the plurality of second lower pads 514. The plurality of second external connection conductors 519 includes external connection conductors 519S for gap adjustment having a volume and a height greater than those of the other external connection conductors 519. The external connection conductors 519S for gap adjustment are components/elements corresponding to the second or third external connection conductors 219B, 219C, and 319B described above in the previous embodiment and may be external connection conductors each of which is formed by merging a plurality of solder balls having the same size as the solder balls each of which forms one of the other external connection conductors 519 in pad regions having the same area. In the present embodiment, the external connection conductors 519S for gap adjustment may be disposed adjacent to edge regions of the second substrate 510 and may be used to compensate for a large gap between the interposer 450 and the second substrate 510 in the edge regions of the second substrate 510.

According to the embodiments described above, by applying a different number of solder balls having the same size to each pad, some external connection conductors may be formed to have different volumes and different heights. Therefore, it is beneficial to compensate for deviations due to warpage (e.g., a gap between a semiconductor package and a substrate) and significantly improve mounting quality of the package (bonding quality between PKGs in the case of a POP structure).

While example embodiments have been illustrated and described above, it will be apparent to those skilled in the art that modifications and variations could be made without departing from the scope of the present inventive concept as defined by the appended claims.

What is claimed is:

1. A semiconductor package comprising:
a base substrate having an upper surface on which a plurality of upper pads are arranged and a lower surface on which a plurality of first and second lower pads are arranged and including an interconnection circuit electrically connecting the plurality of upper pads and the plurality of first and second lower pads;
a semiconductor chip disposed on the upper surface of the base substrate and electrically connected to the plurality of upper pads;
a solder resist layer having a plurality of openings exposing a region of each of the plurality of first and second lower pads, the exposed regions of the plurality of first and second lower pads having substantially the same size;
a plurality of first external connection conductors respectively disposed on the exposed regions of the plurality of first lower pads, each of the first external connection conductors having a first height and a first volume; and
a plurality of second external connection conductors respectively disposed on the exposed regions of the plurality of second lower pads, each of the second external connection conductors having a second height, greater than the first height, and a second volume, greater than the first volume,
wherein a pitch of each of the plurality of first and second lower pads is substantially the same.

2. The semiconductor package of claim 1, wherein the plurality of second lower pads are arranged in a region adjacent to an edge of the base substrate.

3. The semiconductor package of claim 1, wherein the plurality of second external connection conductors are arranged in a central region of the lower surface of the base substrate.

4. The semiconductor package of claim 1, wherein the plurality of second external connection conductors are arranged in a plurality of regions spaced apart from each other on the lower surface of the base substrate.

5. The semiconductor package of claim 1, wherein each of the plurality of first and second external connection conductors has a spherical shape.

6. The semiconductor package of claim 1, wherein the second height of each of the plurality of second external connection conductors is 10% to 40% greater than the first height.

7. The semiconductor package of claim 1, wherein the second height of each of the plurality of second external connection conductors is greater than the first height by at least 10 μm.

8. The semiconductor package of claim 1, wherein the second volume of each of the plurality of second external connection conductors is greater than the first volume by an integer multiple.

9. The semiconductor package of claim 1, wherein the second volume of each of the plurality of second external connection conductors is double or triple the first volume.

10. The semiconductor package of claim 1, wherein the pitch of each of the plurality of first and second lower pads is triple or more of a width of each of the first external connection conductors.

11. The semiconductor package of claim 1, wherein
the base substrate further includes a plurality of third lower pads having regions exposed by the plurality of openings,
wherein the exposed regions of the plurality of third lower pads have substantially the same size as the exposed regions of the plurality of first and second lower pads, and
the semiconductor package includes a plurality of third external connection conductors respectively disposed on the exposed regions of the plurality of third lower pads and each of the plurality of third external conductors having a third height higher than the second height and a third volume greater than the second volume.

12. The semiconductor package of claim 11, wherein the plurality of second external connection conductors are arranged between the plurality of first external connection conductors and the plurality of third external connection conductors.

13. The semiconductor package of claim 1, wherein the base substrate is a printed circuit board.

14. A semiconductor package comprising:
a base substrate having an upper surface on which a plurality of upper pads are arranged and a lower surface on which a plurality of first and second lower pads are arranged and including an interconnection circuit electrically connecting the plurality of upper pads and the plurality of first and second lower pads;
an interposer disposed on the upper surface of the base substrate and having a lower surface on which a plurality of lower connection pads electrically connected to the plurality of upper pads are arranged and an upper surface on which a plurality of upper connection pads electrically connected to the plurality of lower connection pads are arranged;
at least one semiconductor chip disposed on the upper surface of the interposer and electrically connected to the plurality of upper connection pads;
a solder resist layer having a plurality of openings exposing a region of each of the plurality of first and second lower pads, the exposed regions of the plurality of first and second lower pads having substantially the same size;
a plurality of first external connection conductors respectively disposed on the exposed regions of the plurality of first lower pads and each of the plurality of first external conductors having a first height and a first volume; and
a plurality of second external connection conductors respectively disposed on the exposed regions of the plurality of second lower pads and each of the plurality of second external conductors having a second height, greater than the first height, and a second volume, greater than the first volume,
wherein a pitch of each of the plurality of first and second lower pads is substantially the same.

15. The semiconductor package of claim 14, wherein the second height is greater than the first height by 10% to 40% of the first height, and the second volume is an integer multiple of the first volume.

16. The semiconductor package of claim 14, wherein a difference between a highest level and a lowest level of the lower surface of the base substrate is 20 μm or more, and the plurality of first lower pads are arranged in a region adjacent to the lowest level and the plurality of second lower pads are arranged in a region adjacent to the highest level.

17. The semiconductor package of claim 16, wherein the second height is higher than the first height by at least 10 μm.

18. The semiconductor package of claim 14, wherein the pitch between each of the plurality of first and second lower pads is triple a width of each of the first external connection conductors.

19. The semiconductor package of claim 14, wherein the base substrate includes a printed circuit board, and the interposer includes a semiconductor substrate.

20. A semiconductor package comprising:
- a first semiconductor package including a first substrate and a first semiconductor chip disposed on the first substrate;
- a second semiconductor package disposed on the first semiconductor package and including a second substrate and a second semiconductor chip on the second substrate; and
- a connection member disposed between the first semiconductor package and the second semiconductor package and electrically connecting the first semiconductor package to the second semiconductor package, wherein the second semiconductor package includes:
- a plurality of lower pads arranged on a lower surface of the second substrate;
- a solder resist layer disposed on a lower surface of the second substrate, having a plurality of openings exposing a region of each of the plurality of lower pads, the exposed regions of the plurality of lower pads having substantially the same size; and
- a plurality of external connection conductors respectively disposed on the exposed regions of the plurality of lower pads, wherein the plurality of external connection conductors include an external connection conductor having a volume and a height respectively greater than a volume and a height of other external connection conductors, and wherein a pitch of each of the plurality of external connection conductors is substantially the same.

* * * * *